(12) United States Patent
Pan et al.

(10) Patent No.: US 10,168,015 B2
(45) Date of Patent: Jan. 1, 2019

(54) LEDS MOUNTED ON CURVED LEAD FRAME

(71) Applicant: KONINKLIJKE PHILIPS N.V., Eindhoven (NL)

(72) Inventors: Hui Ling Pan, Shanghai (CN); Hiu Tung Chu, Shanghai (CN); Paul Scott Martin, San Jose, CA (US); Jianzhong Pan, Shanghai (CN); Hua Sin Daniel Yew, Bayan Lepas (MY)

(73) Assignee: Koninklijke Philips N.V., Eindhoven (NL)

( * ) Notice: Subject to any disclaimer, the term of this patent is extended or adjusted under 35 U.S.C. 154(b) by 34 days.

(21) Appl. No.: 15/314,192

(22) PCT Filed: May 18, 2015

(86) PCT No.: PCT/EP2015/060823
§ 371 (c)(1),
(2) Date: Nov. 28, 2016

(87) PCT Pub. No.: WO2015/180978
PCT Pub. Date: Dec. 3, 2015

(65) Prior Publication Data
US 2017/0241611 A1    Aug. 24, 2017

(30) Foreign Application Priority Data

May 30, 2014    (WO) ................ PCT/CN2014/000547
Aug. 15, 2014    (EP) ..................................... 14181105

(51) Int. Cl.
*F21V 5/00*        (2018.01)
*F21S 43/19*       (2018.01)
(Continued)

(52) U.S. Cl.
CPC .............. *F21S 43/195* (2018.01); *B60Q 1/30* (2013.01); *B60Q 1/34* (2013.01); *F21K 9/00* (2013.01);
(Continued)

(58) Field of Classification Search
CPC .......... F21S 43/195; F21S 43/14; F21S 43/26; H01L 2224/48091; B60Q 1/2696; F21V 19/001
See application file for complete search history.

(56) References Cited

U.S. PATENT DOCUMENTS

2010/0157595 A1    6/2010 Lin et al.
2012/0182755 A1*   7/2012 Wildner ................. G09F 9/301
                                                              362/555
2014/0140082 A1*   5/2014 Kuboyama ......... H01L 25/0753
                                                              362/510

FOREIGN PATENT DOCUMENTS

DE         10025563 A1    12/2001
EP         0364806 A2     4/1990
(Continued)

OTHER PUBLICATIONS

EPO as ISA, "International Search Report and Written Opinion" dated Jul. 28, 2015 from International Application No. PCT/EP2015/060823, filed May 18, 2015, 11 pages.
(Continued)

*Primary Examiner* — Anh T Mai
*Assistant Examiner* — Matthew J. Peerce

(57) ABSTRACT

An LED lamp includes a metal lead frame strip (14) on which is directly mounted bare LED dies (12), such as in series. Therefore, there is excellent thermal conductivity to the lead frame (14). Lenses (24) are then molded over the LED dies (12) to encapsulate them. The lead frame (14) is then inserted into a mold for a thermally conductive plastic body (38) and is bent in an arc while in the mold so that the
(Continued)

top surfaces of the LED dies (12) are not parallel to each other. The plastic body is molded, and the structure is removed from the mold. The curved lead frame causes the overall light emission to be very wide, such a greater than 270 degrees. In another embodiment, the lead frame strip is supported over a curved outer surface of a pre-molded plastic support. Ends of the lead frame strip are inserted into electrical connectors of the plastic support.

10 Claims, 2 Drawing Sheets

(51) Int. Cl.
| | | |
|---|---|---|
| *F21S 43/14* | (2018.01) | |
| *F21K 9/00* | (2016.01) | |
| *F21K 9/90* | (2016.01) | |
| *H01L 33/62* | (2010.01) | |
| *H01L 25/075* | (2006.01) | |
| *F21S 45/47* | (2018.01) | |
| *F21S 43/20* | (2018.01) | |
| *B60Q 1/30* | (2006.01) | |
| *B60Q 1/34* | (2006.01) | |
| *F21S 43/15* | (2018.01) | |
| *F21W 103/00* | (2018.01) | |
| *F21Y 115/10* | (2016.01) | |
| *F21Y 107/20* | (2016.01) | |

(52) U.S. Cl.
CPC ............... *F21K 9/90* (2013.01); *F21S 43/14* (2018.01); *F21S 43/15* (2018.01); *F21S 43/26* (2018.01); *F21S 45/47* (2018.01); *H01L 25/0753* (2013.01); *H01L 33/62* (2013.01); *B60Q 2400/00* (2013.01); *F21W 2103/00* (2018.01); *F21Y 2107/20* (2016.08); *F21Y 2115/10* (2016.08); *H01L 2924/0002* (2013.01)

(56) References Cited

FOREIGN PATENT DOCUMENTS

| EP | 2615358 A2 | 7/2013 |
| EP | 2671756 A2 | 12/2013 |

OTHER PUBLICATIONS

Extended European Search Report dated Dec. 18, 2014, European Application No. 14181105.9, 6 pages.

* cited by examiner

LEDS MOUNTED ON CURVED LEAD FRAME

CROSS-REFERENCE TO RELATED APPLICATIONS

The present application is a § 371 application of International Application No. PCT/EP2015/060823 filed on May 18, 2015 and entitled "LEDS MOUNTED ON CURVED LEAD FRAME," which claims the benefit of International Application No. PCT/CN2014/000547, filed May 30, 2014 and European Patent Application No. 14181105.9, filed Aug. 15, 2014. International Application No. PCT/EP2015/060823, International Application No. PCT/CN2014/000547, and European Patent Application No. 14181105.9 are incorporated herein.

FIELD OF THE INVENTION

This invention relates to a light emitting diode (LED) lamp and, in particular, to an LED lamp using LED dies directly mounted on a curved lead frame.

BACKGROUND

LEDs generally emit in a Lambertian (hemispherical) pattern. It is conventional to mount one or more LEDs on a flat substrate, having a metal pattern, and provide a hemispherical lens (primary optics) over the LEDs to increase light extraction. The flat substrate and the LED construction inherently block sideways downward light, so the widest emission profile is Lambertian with a 180 degree maximum emission profile. To achieve other than a Lambertian profile from a lamp, secondary optics, including reflectors are used. Such reflectors add size and cost.

In some applications, it would be desirable to provide a compact lamp that has an emission profile wider than a Lambertian profile.

SUMMARY

In one embodiment, bare LED dies have a bottom thermal pad or electrode directly bonded to a metal lead frame strip for good thermal conductivity. The term "bare LED dies" includes unencapsulated semiconductor dies or unencapsulated semiconductor dies that have been mounted on a small submount to simply handling of the LED dies. The LED dies may be vertical LED dies (electrodes on opposite sides), lateral LED dies (both electrodes on top), or flip chip LED dies (both electrodes on bottom).

The lead frame strip and the electrical connections of the LED dies to the lead frame strip result in the LEDs being connected in series as a linear strip of LED dies. The lead frame strip is preferably much wider than the LED dies to better conduct heat away from the LED dies. Other configurations of LED dies on the lead frame strip are also contemplated, such as a wider array where the LED dies are connected in series and/or parallel.

Lenses are then molded over each of the LED dies and the associated lead frame strip portions to improve light extraction and protect the LED dies and any bond wires. A space remains between each lens so that the lead frame strip remains flexible.

The lead frame strip is then bent in an arc so that the overall light emission creates a profile greater than 180 degrees. The lead frame strip is generally resilient, so continuous force is needed to maintain the curvature of the lead frame strip.

A plastic body is then molded over the bent lead frame strip, where the rigid body fixes the shape of the lead frame strip and has openings for the lenses. The body may house any circuitry for driving the LED dies in series, such as one or more current limiting resistors. The body supports anode and cathode leads connected to the lead frame strip, such as for plugging into a socket.

Heat from the LED dies is directly coupled into the lead frame strip and the plastic body. If the plastic is electrically conductive, by containing metal for increased thermal conductivity, the lead frame strip may be selectively coated with a dielectric film. The LED dies or the lenses may include phosphor to create any color of emitted light.

In another embodiment, the lead frame strip is affixed over a curved surface of a rigid pre-molded plastic support, so there is no plastic body molded around the lead frame. The ends of the lead frame are inserted into slots of the plastic support, and the lead frame strip is bent over the curved surface. Therefore, the lead frame strip remains curved. The slots may contain a metal conductor, which is electrically coupled to a connector on the plastic support for powering the LED dies. Prior to affixing the lead frame to the plastic support, the LEDs are encapsulated by a clear lens material, which protects the LEDs, mechanically supports the lead frame strip, increases light extraction, and shapes the light emission. The plastic support may include indentions that help retain the LED dies in position and help direct the LED light.

In the various embodiments, the resulting lamp thus emits light with a very wide angle, such as up to 270 degrees. One use of the resulting compact lamp is as a rear or front turn or stop signal for a motorcycle or automobile, where illumination of the lamp is simultaneously visible to other drivers in back of, to the side of, and/or in front of the motorcycle or automobile.

BRIEF DESCRIPTION OF THE DRAWINGS

Elements that are the same or similar are labeled with the same numeral.

DETAILED DESCRIPTION

Figure 1:
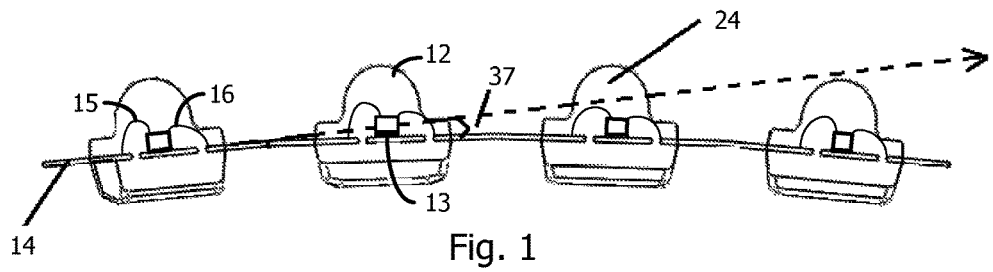
FIG. 1 is a bisected side view of the strip of FIGS. 2 and 3 illustrating the thermal and electrical connections of the LED dies to the lead frame strip and the bending of the lead frame strip.
Figure 2:
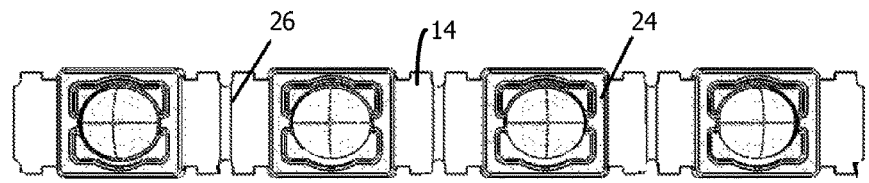
FIG. 2 is a top down view of the strip of FIG. 1.

FIGS. 1 and 2 illustrate the same structure.

Initially, bare LED dies (i.e., not packaged) are fabricated. The term "bare LED dies" includes unencapsulated semiconductor dies or unencapsulated semiconductor dies that have been mounted on a small submount to simply handling of the LED dies. In one embodiment, the LED dies are lateral LED dies with both electrodes on top. In another embodiment, the LED dies are vertical LED dies with one top electrode and a large bottom electrode. In another embodiment, the LED dies are flip chip LED dies with both electrodes on the bottom.

In all cases, the LED dies 12 have a large bottom metal pad 13 that is soldered or welded to the surface of a lead frame strip 14. The lead frame strip 14 will typically be copper or steel, so there is excellent coupling of heat from the LED dies 12 to the lead frame strip 14. The LED dies 12 are shown relatively much larger than actual in FIG. 1 to illustrate the electrical connections between the LED dies 12 and the lead frame strip 14. The LED dies 12 will typically be less than 1 mm per side and less than 1 mm in height if no submount is used.

The lead frame strip 14 is initially connected to many other lead frame strips stamped from a flat sheet. The metal connections between the lead frame strips are later cut during singulation. This allows all the lead frame strips in the array to be processed simultaneously, and handling is simplified. Further, by initially connecting all the lead frame strips together, each individual lead frame strip may have gaps (allowing the LED dies to be connected in series) yet still be mechanically held together by the remaining portion of the lead frame array.

In the example, it is assumed that the LED dies 12 are lateral LED dies, where the LED dies 12 have top anode and cathode electrodes. After the bottom metal pad 13 of the bare LED dies 12 are soldered or welded to the lead frame strip 18, the top electrodes are connected with wires 15 and 16 to the lead frame strip 14 using conventional wire bonding tools. Note that the lead frame strip 14 is discontinuous to allow the LED dies 12 to be connected in series; however, the lead frame strip 14 portions are initially held together by the lead frame array prior to singulation and later held together by molded epoxy or silicone lenses after singulation.

In another embodiment, the LED dies are vertical LEDs with one electrode on top and one electrode on the bottom. The bottom electrode is directly bonded to the lead frame strip 14, and the lead frame strip 14, along with the wire bond to the top electrode, connect the LED dies in series. The LED dies may also be flip-chips, requiring no wire bonding, and the lead frame strip 14 connects the LED dies in series.

Figure 3:
FIG. 3 is a side view of two of the LED dies mounted on the lead frame strip and electrically connected to the strip to be in series, where lenses are molded over the LED dies.

The entire array of lead frame strips is then placed in a mold defining lenses around each of the LED dies 12 and the underlying lead frame portion. Clear epoxy is then injected into the mold, or the mold may be a compression mold with the liquid epoxy already residing in the mold indentations prior to the lead frame being placed in the mold. The epoxy is then cured, and the lead frame array is removed from the mold. Two different epoxy lenses 22 and 24 are shown in FIG. 3 as an example of how the various LED dies 12 on a single lead frame strip 14 may have different emission patterns. The conical lens 22 results in more sidelight than the hemispherical lens 24. In FIGS. 1 and 2, only lens 24 is used. The lens material may be transparent or diffusive silicone other materials.

If the LED light needs to be converted to a different color, each LED die 12 may have a phosphor coating or a phosphor plate, or phosphor may be infused in the lens material before molding.

Since the lenses 24 are molded around the lead frame strip 14 and now bridge the gaps in the lead frame strip 14, the lead frame strip 14 may be singulated from the lead frame array by cutting the metal around the lead frame strip 14. The LED dies 12 are now electrically connected in series by the wires 15/16 and lead frame strip 14.

FIG. 2 is a top down view and illustrates that the lead frame strip 14 has either thinned and/or narrowed areas 26 which are easily bent and which minimize bending stress on the areas of the lead frame strip 14 with the lenses 24.

Figure 4:
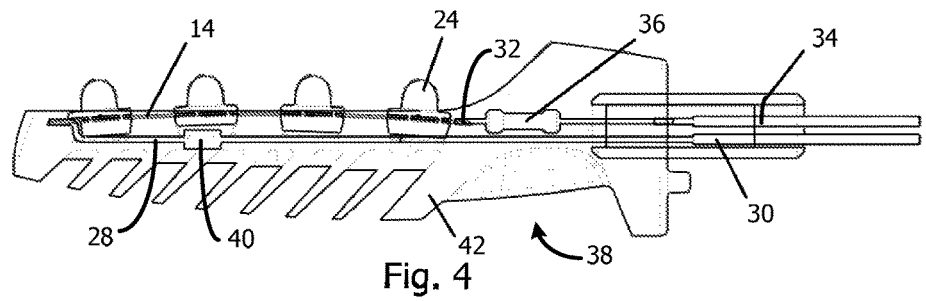
FIG. 4 is a bisected side view of a completed lamp, with a plastic body molded over the bend lead frame strip.

As shown in FIG. 4, one end of the lead frame strip 14 is soldered or welded to a cathode lead 28, which forms a prong 30 at its opposite end for being inserted into a socket. The other end of the lead frame strip 14 is soldered or welded to an anode lead 32, which forms a prong 34 at its opposite end for being inserted into the socket. The cathode and anodes of the LED dies 12 may be reversed.

In the example of FIG. 4, a current limiting resistor 36 is connected in-line with the anode lead 32.

The lead frame strip 14 is then bent to any radius for the particular application. FIG. 1 illustrates the bending of the strip 14 at a particular bending angle 37. In the example, the angle 37 is about 10 degrees, but the angle may be much higher, such as up to 270 degrees. The lead frame strip 14 may retain its bent shape naturally. In another embodiment, a bending force must be continuously applied to the lead frame strip 14 during the plastic body molding step. In the example of FIG. 4, the cathode lead 28 includes a bump 40 that causes the lead frame strip 14 to be pushed away from the more rigid cathode lead 28 to create the desired bend. Other means of creating and maintaining a bend in the lead frame strip 14 while the strip 14 is in the mold may be used, such as by pins, flanges, or other means. In another embodiment, the molding process is designed so that the pressure of the molding material bends the lead frame strip 14.

A thermally conductive plastic is then injected into the mold to encapsulate the lead frame strip 14 for protection and mechanical stability. Compression molding may also be used. The mold shape is defined so that the molded plastic body 38 does not cover the tops of the lenses 24, so there is no light absorption by the plastic body 38. The body 38 may be opaque or transparent, depending on the application.

If the LED dies 12 are to be on for long periods, it is important for the plastic to be highly thermally conductive. Very high thermally conductive plastics are also electrically conductive since they contain metal. If such a plastic is to be used, the exposed portion of the lead frame strip 14 is first coated with a dielectric layer prior to the body molding step. Such a dielectric layer may be formed prior to the step of forming the lenses 24, so as to be covered by the edges of the lenses 24, to ensure that the dielectric layer covers all areas of the lead frame strip 14 that may be contacted by the plastic body 38.

The body 38 is shown having fins 42 for better air cooling.

Figure 5:
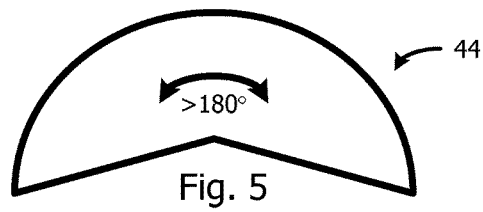
FIG. 5 is an emission profile of the lamp of FIG. 4 illustrating how light is emitted over greater than 180 degrees for viewing at wide angles.

The lamp of FIG. 4 may then be plugged into a socket. When the LED dies 12 are turned on, the overall light emission profile from the combination of the LED dies 12 may resemble the profile 44 of FIG. 5, which is greater than 180 degrees. In contrast, the profile would be a maximum of 180 degrees if the lead frame strip 14 was not bent. In the example, the emission profile from the lens 24 of each LED die 12 is Lambertian, where the vast majority of the light is emitted from the flat top surface of each LED die 12.

In other embodiments, the lead frame strip 14 is bent such that the end LED dies 12 are 90 degrees with respect to one another to achieve a 270 degree emission profile for the lamp.

Figure 6:
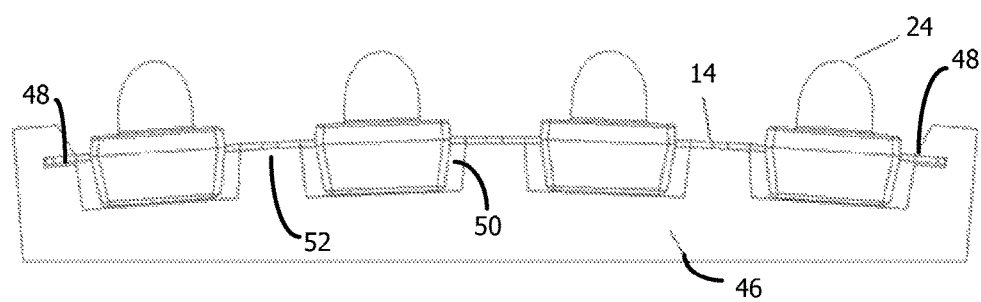
FIG. 6 is a cross-sectional view of a lamp where the curved lead frame strip is supported over a curved surface of a plastic support, where the LEDs are encapsulated, and where a bottom portion of the encapsulation is located within an indentation in the plastic support.
Figure 7:
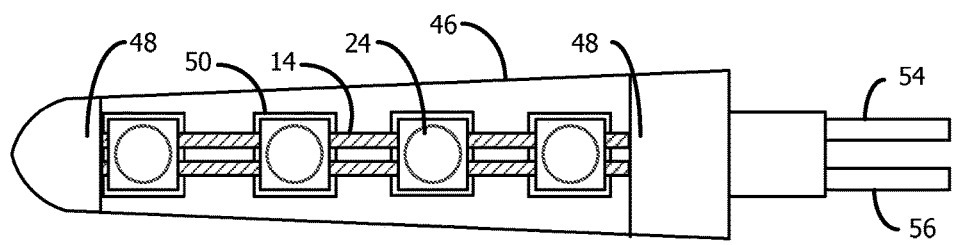
FIG. 7 is a top down view of the structure of FIG. 6.

In another embodiment, shown in FIGS. 6 and 7, the lead frame strip 14 is affixed to a curved surface of a rigid pre-molded, dielectric plastic support 46, so there is no plastic body molded around the lead frame strip 14. The LED dies 12 (shown in FIG. 1) are connected in series by the lead frame strip 14 and wires, assuming the LED dies are not a flip chips. The bottom pads of the LED dies 12 are directly bonded to the lead frame strip 14 for good heat conduction. The LED dies are encapsulated by the transparent or diffusive lens 24 material (e.g., epoxy or silicone) to protect them, mechanically support the lead frame strip 14, increase light extraction, and shape the light emission.

The ends of the lead frame strip 14 are inserted into slots 48 of the plastic support 46 to secure the lead frame strip 14 in place, and the plastic support 46 has a curved surface which the lead frame strip 14 bends around to conform to the plastic support 46. Therefore, the lead frame strip 14 remains curved. The slots 48 may have one or more metal surfaces to form female metal connectors that supply power to the ends of the lead frame strip 14 to illuminate the serial string of LEDs. The power conductors, such as wires or metal strips, may be molded into the plastic support 46, and terminate at an end of the plastic support 46 as a standardized connector, such as a plug having leads 54 and 56 (FIG. 7) or a socket. By using this approach, the lead frame strip 14 is interchangeable without requiring a different plastic support 46. For example, the same type of plastic support 46 may support lead frame strips having yellow LEDs or having red LEDs, depending on the application, such as an automobile turn signal or a stop light. The different lamps may be housed in the same reflector of the automobile.

The plastic support 46 includes indentions 50, and the bottom portions of the encapsulant (formed of the lens 24 material) are inserted into associated indentions 50. This helps to secure the LEDs in position and help direct the LED light. The plastic support 46 may be formed of a reflective material, such as a white plastic. The lead frame strip 14 is shown being supported by the mesa areas 52 between the indentations 50. The indentations 50 may have the square or rectangular shape of the encapsulant, shown in FIG. 7.

The light emission from the lamp of FIGS. 6 and 7 is greater than 180 degrees, at least along the plane bisecting the lamp in the lengthwise direction. The lead frame strip 14 may be bent much more than shown in FIG. 6, such as up to 270 degrees between the ends of the lead frame strip 14. Accordingly, the plastic support 46 may have more of a circular outer surface.

Many other shapes of lamps may be formed using the concepts of the present invention, where LED dies are connected in series on a bent lead frame strip so that the flat, top light-emitting surfaces of the LED dies are in different planes, such as forming an arc.

In another embodiment, the LED dies 12 may be connected in parallel or a combination of series and parallel. This may be easily accomplished by the configuration of the lead frame and the wires connecting the lead frame to the LED die electrodes. Many more than four LED dies may be connected to the lead frame strip depending on the desired brightness, the desired shape of the light emission, and the desired voltage drop. For example, for a 12 volt power supply such as a car battery, the number of series-connected LED dies needed to drop 12 volts depends on the type of LED die used, which depends on the desired color emission.

The voltage drop per LED die ranges from about 2 volts (for red) to about 3.8 volts (for blue). Blue light may be phosphor-converted to a longer wavelength light. Therefore, the number of serially-connected LED dies needed to drop 12 volts may range from three to six. If higher brightness is desired, multiple LED dies may additionally be connected in parallel.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

The invention claimed is:

1. A light emitting structure, comprising:
a plurality of bare light emitting diode (LED) dies, the LED dies having at least one bottom metal pad, the LED dies having a top surface that emits light;
a metal lead frame strip, the bottom metal pad of each of the LED dies being thermally affixed to a first surface of the lead frame strip, electrodes of the LED dies being electrically connected to the lead frame strip so that the LED dies are electrically interconnected;
lenses formed overlying the LED dies, the lenses being formed of a lens material, where the lens material encapsulates the LED dies and a portion of the lead frame strip; and
a support for the metal lead frame strip;
wherein the lead frame strip is bent while supported by the support such that top surfaces of at least some of the LED dies are in different planes,
wherein the support comprises a rigid pre-molded support defining a first slot (48) for receiving one end of the lead frame strip and defining a second slot (48) for receiving an opposite end of the lead frame strip,
wherein the support includes metal leads (54, 56) for connection to a power supply, and wherein the metal leads are electrically coupled to the first slot and the second slot,
wherein the support further comprises areas (50, 52) between the first slot and second slot that support the lead frame strip and define a curvature of the lead frame strip,
wherein the support supplies a continuous force to the lead frame strip to maintain a curvature of the lead frame strip,
wherein the rigid pre-molded support defines indentations and mesas between the indentations, and
wherein bottom portions of the lens material are inserted into the indentations to secure the LED dies in position.

2. The structure of claim 1, wherein the support defines a curvature of the lead frame strip.

3. The structure of claim 1, wherein the LED dies are connected at least in series.

4. The structure of claim 1, wherein the LED dies comprise at least four LED dies.

5. The structure of claim 1, wherein the lead frame strip is curved at least at a 10 degree angle.

6. The structure of claim 1, wherein the LED dies are arranged along an arc on the bent lead frame strip.

7. The structure of claim 1, wherein a portion of the lead frame strip is not covered by the lens material so as to be bendable in areas between the LED dies.

8. The structure of claim 1, wherein the structure forms a rear signal lamp in an automobile.

9. The structure of claim 1, wherein a light emission profile of the LED dies while supported by the bent lead frame strip is greater than 180 degrees.

10. The structure of claim 1, wherein the LED dies are connected in series and a voltage drop across the structure is about 12 volts.

* * * * *